United States Patent
Gruening et al.

(12) 
(10) Patent No.: US 6,271,142 B1
(45) Date of Patent: Aug. 7, 2001

(54) PROCESS FOR MANUFACTURE OF TRENCH DRAM CAPACITOR BURIED PLATES

(75) Inventors: Ulrike Gruening, Wappingers Falls; Carl J. Radens, LaGrangeville, both of NY (US); Dirk Tobben, Dresden Ot Langebrueck (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/354,743

(22) Filed: Jul. 29, 1999

(51) Int. Cl.[7] .................................................. H01L 21/311
(52) U.S. Cl. ............................ 438/696; 438/700; 438/745
(58) Field of Search ..................................... 438/745, 700, 438/696

(56) References Cited

U.S. PATENT DOCUMENTS

| | | | |
|---|---|---|---|
| 4,782,036 | 11/1988 | Becker et al. | 437/164 |
| 5,182,224 | 1/1993 | Kim et al. | 437/52 |
| 5,200,354 | 4/1993 | Om et al. | 437/52 |
| 5,352,622 | * 10/1994 | Chung | 437/52 |
| 5,482,883 | 1/1996 | Rajeevakumar | 437/52 |
| 5,616,961 | * 4/1997 | Kohyama | 257/774 |
| 5,618,751 | * 4/1997 | Golden et al. | 438/392 |
| 5,656,535 | 8/1997 | Ho et al. | 438/386 |
| 5,693,568 | * 12/1997 | Liu et al. | 437/195 |
| 5,710,061 | * 1/1998 | Cleeves | 437/195 |
| 6,057,216 | * 5/2000 | Economikos et al. | 438/559 |

FOREIGN PATENT DOCUMENTS

| | | |
|---|---|---|
| 735581 | 10/1996 | (EP) . |
| 791959 | 8/1997 | (EP) . |
| 306061 | 6/1901 | (TW) . |

OTHER PUBLICATIONS

IBM Technical Disclosure Bulletin vol. 27, No. 11, Apr. 1985.
Isolation Trench Filling by M. Arienzo and R.D. Isaac.

\* cited by examiner

*Primary Examiner*—Benjamin L. Utech
*Assistant Examiner*—Vanessa Perez-Ramos
(74) *Attorney, Agent, or Firm*—Ratner & Prestia

(57) ABSTRACT

A process for manufacturing a deep trench capacitor in a trench. The capacitor comprises a collar in an upper region of the trench and a buried plate in a lower region of the trench. The improvement comprises, before forming the collar in the trench upper region, filling the trench lower region with a non-photosensitive underfill material such as spin-on-glass. The process may comprise the steps of (a) forming a deep trench in a substrate; (b) filling the trench lower region with an underfill material; (c) forming a collar in the trench upper region; (d) removing the underfill; and (e) forming a buried plate in the trench lower region.

19 Claims, 2 Drawing Sheets

PROCESS FOR MANUFACTURE OF TRENCH DRAM CAPACITOR BURIED PLATES

TECHNICAL FIELD

The present invention relates generally to semiconductor circuitry and, more specifically, to the manufacture of Dynamic Random Access Memory (DRAM) deep trench storage capacitors and buried plates in such capacitors.

BACKGROUND OF THE INVENTION

Dynamic Random Access Memory (DRAM) cells within semiconductor circuits typically incorporate deep trench storage capacitors. As the lithographic ground rules used to pattern such deep trench storage capacitors continue to diminish with each successive generation of DRAM technology, it is desired to reduce process complexity and to increase manufacturing tolerances. Buried plate diffusion regions are commonly used to connect the plate region of a deep trench storage capacitor array. Current processes for making such buried plate diffusion regions add process steps and process complexity, however, to the cost-sensitive DRAM manufacturing process.

For example, a standard process for manufacturing DRAM trench capacitor buried plates may comprise:

(a) etching a trench in a surface of a substrate;
(b) forming a barrier layer on the trench side wall;
(c) filling the trench with photoresist;
(d) etching the photoresist to a predetermined depth, controlling the depth by the amount of etch time, the depth defining a filled lower region and an exposed upper region;
(e) removing the barrier layer in the upper region to expose the underlying side wall;
(f) stripping the photoresist;
(g) forming a collar on the side wall upper portion, using the barrier layer as a mask in the lower region; and
(h) forming a buried plate diffusion region in the trench lower region, using the collar as a mask for the upper portion.

The above process, using a photoresist fill and etch step, is commonly called a photoresist recess technique. Because the steps of filling with photoresist and etching add process complexity, it is desirable to simplify and shorten the process for formation of buried plate diffusion regions in deep trench storage capacitors by eliminating the photoresist fill and etch steps.

The deficiencies of the conventional methods used to manufacture DRAM deep trench storage capacitors and buried plates in such capacitors show that a need still exists for an improved process. To overcome the shortcomings of the conventional methods, a new process is provided. An object of the present invention is to simplify and shorten the process for formation of buried plate diffusion regions in deep trench storage capacitors. A related object is to eliminate the photoresist fill and etch steps typically used in conventional methods.

SUMMARY OF THE INVENTION

To achieve these and other objects, and in view of its purposes, the present invention provides a process for manufacturing a deep trench capacitor in a trench. The capacitor comprises a collar in an upper region of the trench and a buried plate in a lower region of the trench. The improvement comprises, before forming the collar in the trench upper region, filling the trench lower region with a non-photosensitive underfill material. The process comprises the steps of (a) forming a deep trench in a substrate, the trench having side walls, a bottom, an upper region, and a lower region; (b) filling the trench lower region with the non-photosensitive underfill material, such as spin-on-glass; (c) forming a collar in the trench upper region; (d) removing the underfill; and (e) forming a buried plate in the trench lower region.

The process of the present invention may be performed sequentially in a first order (a), (b), (c), (d), (e), or in a second order (a), (b), (d), (c), (e). When the process is performed in the first order, step (c) may comprise (i) conformally depositing a dielectric material, such as an oxide or oxynitride, by chemical vapor deposition (CVD) over the substrate (or pad film over the substrate), the trench side walls, and the underfill; then (ii) etching the dielectric over the pad film and the underfill, leaving a dielectric collar on the trench side walls.

When the process is performed in the second order recited above, the process may further comprise, between steps (a) and (b), the step of forming a barrier film over the substrate (or pad film over the substrate), the trench side walls, and the trench bottom. Such process may then further comprise, between steps (b) and (d), a step of removing the barrier film from the trench side walls in the upper region. Then, step (c) may comprise growing the collar by thermal oxidation.

Thus, the present invention may comprise the process of sequentially performing the steps of: (a) forming a pad film layer over a substrate; (b) forming a deep trench through the pad film layer and into the substrate; (c) filling the trench lower region with spin-on-glass underfill; (d) conformally depositing a dielectric material over the pad film, the trench side walls, and the spin-on-glass underfill; (e) etching the dielectric material over the pad film and the spin-on-glass underfill, leaving a collar of dielectric material on the trench side walls in the trench upper region; (f) removing the spin-on-glass underfill; and (g) forming a buried plate in the lower region.

The invention also may comprise the process of sequentially performing the steps of: (a) forming a pad film layer over a substrate; (b) forming a deep trench through the pad film layer and into the substrate; (c) forming a barrier film over the substrate, the trench side walls, and the trench bottom; (d) filling the trench lower region with spin-on-glass underfill; (e) etching the barrier film from the trench side walls in the upper region; (f) removing the spin-on-glass underfill; (g) thermally oxidizing the trench side walls in the upper region to grow a collar; and (h) forming a buried plate in the lower region.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
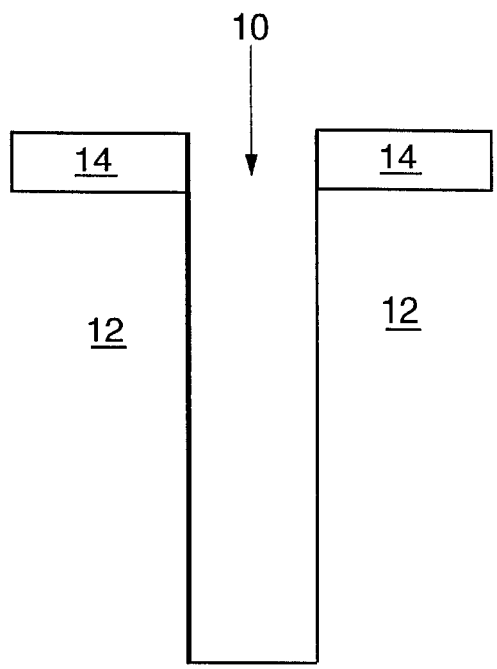
FIG. 1 is a schematic cross-section illustrating a deep trench formed, as a first step in the process of manufacture according to an exemplary embodiment of the present invention, in a substrate and in a pad layer disposed over the substrate.

Referring now to the drawing, wherein like reference numbers refer to like elements throughout, FIGS. 1 through 5 illustrate a deep trench in the process of manufacture according to an exemplary embodiment of the present invention. First, as shown in FIG. 1, a deep trench 10 is formed in a substrate 12 using conventional techniques well known to those skilled in the art, for example, by photolithography and dry etching, such as reactive ion etching (RIE). Substrate 12 typically has disposed over substrate 12 a pad layer 14, such as a silicon nitride (SiN) film having a thickness of about 10 nm to about 500 nm. When pad layer 14 is present, trench 10 penetrates both pad layer 14 and substrate 12, as shown in FIG. 1, and trench 10 has a depth of about 3 $\mu$m to about 10 $\mu$m in substrate 12.

Figure 2:
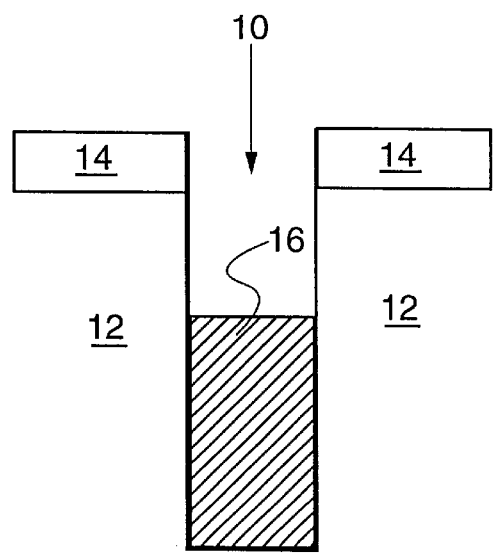
FIG. 2 is a schematic cross-section illustrating an underfill deposited, as a second step in the process of manufacture according to the exemplary embodiment of the present invention, in the deep trench shown in FIG. 1.

After the trench etch step, an non-photosensitive material, forming underfill 16, is applied as shown in FIG. 2. Underfill 16 may be, for example, a spin-on-glass (SOG) film. This step is typically performed on a clean track (not shown) that combines one or more coating stations, a series of baking and heating plates, and a handler robot, as is well-known in the art.

The SOG application process typically comprises depositing a wafer (not shown) on a chuck (not shown) of a coating station (not shown), applying a fixed amount of SOG liquid pre-cursor (not shown) through a nozzle (not shown), and accelerating the wafer to a circular motion at a certain spin-coating velocity. For better uniformity, it may be advantageous to start spinning at a moderate, dynamic dispense speed before applying the SOG liquid pre-cursor. The final SOG liquid pre-cursor film thickness is determined not so much by the amount of deposited precursor, but by the circular acceleration and the final spin speed, typically on the order of about 1,000 to 5,000 rpm. For typical, commercially available SOG materials, such as the Flowable Oxide FOx® material manufactured by Dow Corning of Midland, Mich., such processing leads to films having a thickness of between about 250 to about 10,000 Angstroms with uniformity of typically 0.5% $\sigma$ on a planar substrate. Depending upon the material used and the deposition target, multiple coatings may need to be applied.

After leaving the spin coater, the wafer is baked, such as on a series of hotplates (not shown). The hotplates typically operate at a temperature of between about 70° C. and about 350° C. Some hotplates can reach temperatures of approximately 450° C. The baking step is performed under a controlled atmosphere to drive out solvents in the SOG precursor, to reflow the SOG film for optimum uniformity and gap-fill, and to initiate cross-linking of the precursor into an amorphous SOG mesh. Depending on the material used and the deposition target, multiple coating and baking sequences may need to be applied.

Oxide films thus deposited are less dense than Pressure Enhanced Chemical Vapor Deposition (PECVD) oxides and consequently have a higher wet etch rate. Although additional thermal treatment can increase the SOG oxide density, the SOG still typically maintains an increased wet etch rate in restricted geometry such as the trenches present in the subject invention.

The planarizing and gap-filling capabilities inherent in the use of the liquid SOG pre-cursor are advantageous to filling the trenches to the desired height. FOx® material is particularly self-planarizing and tends to flow to fill between elevated structures unless the elevated structures are laterally smaller than a material-specific "flow length" of about 20 $\mu$m. Thus, in the present application, the SOG film builds to the same thickness in unpatterned regions of the wafer as it does on a flat wafer, but in patterned regions it fills the trenches first before material accumulates between or above the trenches. Thus, the level of fill in the trenches can be estimated by determining the volume of trenches in a given area and comparing the trench volume to the volume of film that would be deposited on a flat substrate having the same area. Dummy structures are typically formed at the edge of the trench-patterned area to ensure good uniformity of fill in all active trenches.

Thus, using a SOG process, the fill height is determined by the deposition parameters and by the geometry of the trenches and the trench-patterned region, rather than by an etch process as in a photoresist recess step. Because of adhesion effects, a small film of SOG material may stick to the side walls of the trenches. This film can be easily removed by an isotropic etch process, such as a short dip in very dilute hydrofluoric acid (HF), for example a dip of 30 seconds to 3 minutes in a 40:1 to 500:1 (deionized water-:hydrogen fluoride) solution.

Figure 3:
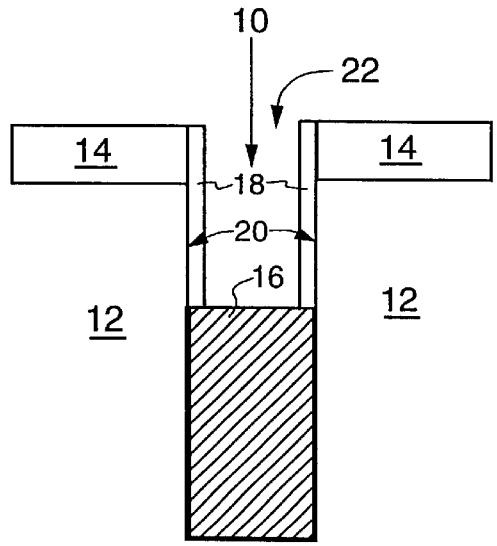
FIG. 3 is a schematic cross-section illustrating a collar formed, as a third step in the process of manufacture according to the exemplary embodiment of the present invention, on the side walls in the upper region of the trench not filled with underfill.

As shown in FIG. 3, in a preferred embodiment of the present invention, a side wall spacer of collar 18 is formed on side walls 20 in the upper region 22 (the portion of trench 10 not filled with underfill 16) of trench 10. Collar 18 may be formed by a conformal deposition of dielectric material such as a CVD oxide or a nitrogen-containing oxide (oxynitride) over substrate 12 (or over pad layer 14 on substrate 12), over trench side walls 20, and over underfill 16. Next, an anisotropic dry etch, such as RIE, is used to remove the dielectric material from any horizontal surfaces (over substrate 12, or pad layer 14, and over underfill 16), leaving only collar 18 on side walls 20. The depth of collar 18 is thus determined by the upper extent of underfill material 16. The RIE etchant may comprise a feed gas combination including, but not limited to, one or more of $CF_4$, $CHF_3$, $NF_3$, $O_2$, $N_2$, or Ar.

Figure 4:
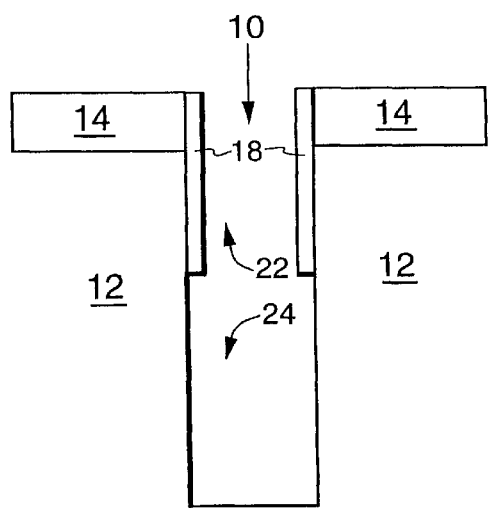
FIG. 4 is a schematic cross-section illustrating the removal of the underfill, from the lower region of the trench, as a fourth step in the process of manufacture according to the exemplary embodiment of the present invention.

As shown in FIG. 4, underfill material 16 may then be wet stripped from the lower region 24 of trench 10 using, for example, an HF-containing solution. Accordingly, the material of collar 18 is chosen to provide wet etch selectivity to underfill 16. Oxynitride is a suitable material for collar 18. Therefore, collar 18 serves as a mask in upper region 22 during subsequent steps to form the buried plate in lower region 24.

Figure 5:
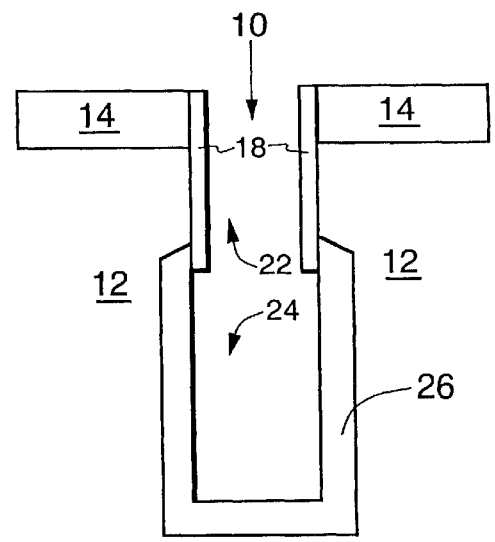
FIG. 5 is a schematic cross-section illustrating formation of a buried plate in the substrate, the final step in the process of manufacture according to the exemplary embodiment of the present invention.

Next, as shown in FIG. 5, buried plate 26 is formed as an out-diffusion in substrate 12. The out-diffusion that forms buried plate 26 may be formed using arsenosilicon glass (ASG) drive-in, plasma doping (PLAD), plasma ion implantation (PIII), gas-phase diffusion, or other techniques known in the art.

Figure 6:
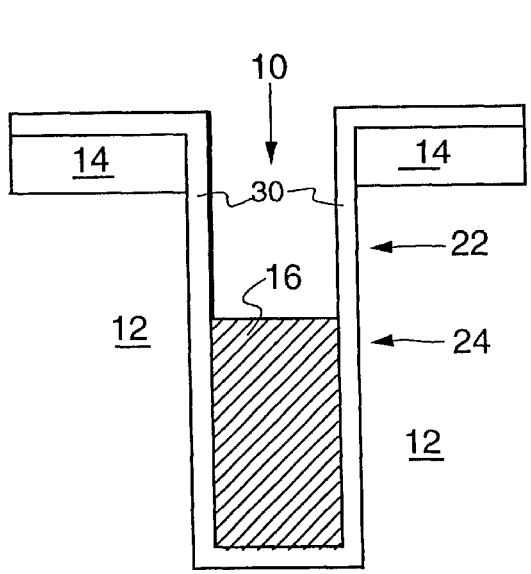
FIG. 6 is a schematic cross-section illustrating an alternative exemplary embodiment of the present invention in which the trench is first coated with a thin barrier film before the underfill is deposited in the trench.
Figure 7:
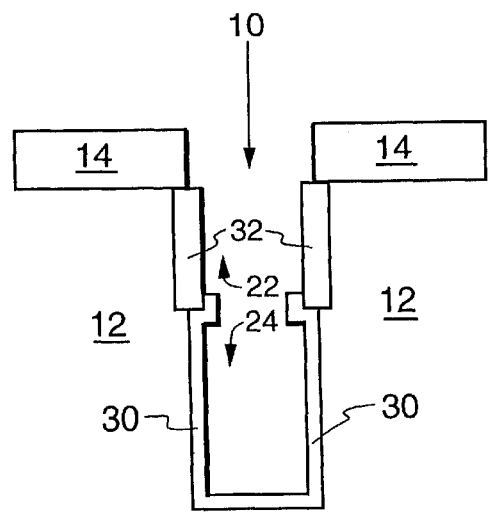
FIG. 7 is a schematic cross-section illustrating the next step, of the alternative exemplary embodiment of the present invention, in which the underfill is removed from the lower region and a collar is formed in the upper region of the trench.

Referring now to FIGS. 6 and 7, in an alternative embodiment, trench 10 of FIG. 1 may be first coated with a thin barrier film 30. Barrier film 30 may typically be a SiN film deposited by CVD to a thickness of about 3 nm to about 20 nm. Then, underfill 16 may be deposited in trench 10 as described previously. Barrier film 30 may then be removed from upper region 22 of trench 10, typically by a chemical etch such as with a wet solution containing phosphoric acid or HF. Underfill 16 masks lower region 24 during removal of barrier film 30 in upper region 22.

Then, as shown in FIG. 7, underfill 16 is removed from lower region 24, such as by stripping with an HF-containing chemical, and collar 32 is formed in upper region 22, such as by thermal oxide growth by a local oxidation process (LOCOS). Such a local oxidation step may comprise exposure to oxygen ($O_2$) or water ($H_2O$) at a temperature of between about 800° C. and about 1,100° C. Barrier film 30 masks lower region 24 from the oxide growth process. Barrier film 30 may then be removed, and collar 32 in upper region 22 may then serve as a mask for the subsequent formation of buried plate 26 by out-diffusion, as described above. Alternatively, collar 32 may serve as an isolation collar.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A process for manufacturing a deep trench capacitor in a deep trench wherein the capacitor comprises a collar in an upper region of said trench and a buried plate in a lower region of said trench, the process comprising the steps of:
    (a) forming said deep trench in a substrate;
    (b) filling the trench lower region with a non-photosensitive, spin-on-glass, underfill material;
    (c) forming said collar in the trench upper region;
    (d) removing said underfill; and
    (e) forming said buried plate in said lower region,
    wherein the recited steps are performed sequentially in an order (a), (b), (c), (d), (e).

2. The process of claim 1 further comprising, before step (a), creating a pad film over said substrate and, in step (a), forming said trench through said pad film and into said substrate.

3. The process of claim 1 wherein step (d) comprises removing said underfill by wet stripping with a chemical solution containing hydrogen fluoride.

4. The process of claim 1 wherein step (e) comprises forming said buried plate using a method selected from the group consisting of ASG drive-in, plasma doping, plasma ion implantation, and gas phase diffusion.

5. The process of claim 1 wherein step (c) comprises:
    (i) conformally depositing a dielectric material over said substrate, said trench side walls, and said underfill; and
    (ii) etching said dielectric material over said substrate and said underfill, leaving a dielectric collar on the trench side walls.

6. The process of claim 5 wherein step (c)(i) comprises depositing said dielectric material by chemical vapor deposition, wherein said dielectric material is one of an oxide and an oxynitride.

7. The process of claim 6 wherein step (c)(ii) comprises etching said dielectric over said substrate and said underfill by an anisotropic dry etch.

8. The process of claim 7 wherein step (c)(ii) comprises etching said dielectric over said substrate and said underfill by reactive ion etching.

9. The process of claim 1 wherein step (b) of filling the trench lower region with non-photosensitive underfill comprises applying a spin-on-glass film.

10. A process for manufacturing a deep trench capacitor in a deep trench wherein the capacitor comprises a collar in an upper region of said trench and a buried plate in a lower region of said trench, the process comprising the steps of:
    (a) forming said deep trench in a substrate;
    (b) filling the trench lower region with a non-photosensitive, spin-on-glass, underfill material;
    (c) removing said underfill;
    (d) forming said collar in the trench upper region; and
    (e) forming said buried plate in said lower region,
    wherein the recited steps are performed sequentially in an order (a), (b), (c), (d), (e).

11. The process of claim 10 wherein said trench further comprises side walls and a bottom, the process further comprising, between steps (a) and (b), a step of forming a barrier film over said substrate, said trench side walls, and said trench bottom.

12. The process of claim 11 wherein a pad film exists over said substrate and the step of forming the barrier film comprises forming said barrier film over said pad film.

13. The process of claim 11 further comprising, between steps (b) and (d), a step of removing the barrier film from said trench side walls in said upper region.

14. The process of claim 13 further comprising removing the barrier film with a chemical etch.

15. The process of claim 14 wherein the chemical etch step comprises etching with a wet solution containing phosphoric acid.

16. The process of claim 13 wherein step (c) comprises growing said collar by thermal oxidation.

17. The process of claim 10 wherein step (b) of filling the trench lower region with non-photosensitive underfill comprises applying a spin-on-glass film.

18. A process for manufacturing a deep trench capacitor, the process comprising sequentially performing the steps of:
    (a) forming a pad film layer over a substrate;
    (b) forming a deep trench through said pad film layer and into said substrate, said trench having side walls, a bottom, an upper region, and a lower region;
    (c) filling the trench lower region with spin-on-glass underfill;
    (d) conformally depositing a dielectric material over said pad film, said trench side walls, and said spin-on-glass underfill;
    (e) etching said dielectric material over said pad film and said spin-on-glass underfill, leaving a collar of dielectric material on the trench side walls in the trench upper region;

(f) removing said spin-on-glass underfill; and (g) forming a buried plate in said lower region.

19. A process for manufacturing a deep trench capacitor, the process comprising sequentially performing the steps of:

(a) forming a pad film layer over a substrate;

(b) forming a deep trench through said pad film layer and into said substrate, said trench having side walls, a bottom, an upper region, and a lower region;

(c) forming a barrier film over said substrate, said trench side walls, and said trench bottom;

(d) filling the trench lower region with spin-on-glass underfill;

(e) etching the barrier film from said trench side walls in said upper region;

(f) removing said spin-on-glass underfill;

(g) thermally oxidizing said trench side walls in said upper region to grow a collar; and (h) forming a buried plate in said lower region.

* * * * *

UNITED STATES PATENT AND TRADEMARK OFFICE
CERTIFICATE OF CORRECTION

PATENT NO.      : 6,271,142 B1
DATED           : August 7, 2001
INVENTOR(S)     : Ulrike Gruening et al.

It is certified that error appears in the above-identified patent and that said Letters Patent is hereby corrected as shown below:

<u>Title page,</u>
Item [73], insert second assignee -- Infineon Technologies North America Corp., San Jose, California (US) --

Signed and Sealed this

Nineteenth Day of August, 2003

JAMES E. ROGAN
*Director of the United States Patent and Trademark Office*